United States Patent [19]

Ando et al.

[11] Patent Number: 5,040,219

[45] Date of Patent: Aug. 13, 1991

[54] SOUND REPRODUCING APPARATUS

[75] Inventors: Yoichi Ando, Kobe; Fujio Hayakawa, Amagasaki, both of Japan

[73] Assignee: Mitsubishi Denki Kabushiki Kaisha, Tokyo, Japan

[21] Appl. No.: 430,269

[22] Filed: Nov. 2, 1989

[30] Foreign Application Priority Data

Nov. 5, 1988 [JP] Japan ................................ 63-280038

[51] Int. Cl.[5] ................................ H03G 3/00

[52] U.S. Cl. ................................ 381/61; 381/63

[58] Field of Search ................ 84/626, 627, 630, 654, 84/662, 663, 701, 702, 707; 381/63, 61

[56] References Cited

U.S. PATENT DOCUMENTS

| | | | |
|---|---|---|---|
| 4,649,564 | 3/1987 | Barnett | 381/63 |
| 4,694,497 | 9/1987 | Kasai et al. | 381/63 |
| 4,706,291 | 11/1987 | Kakubo et al. | 381/63 |

FOREIGN PATENT DOCUMENTS

| | | |
|---|---|---|
| 57-18338 | 2/1982 | Japan . |
| 60-60072 | 12/1985 | Japan . |
| 60-60073 | 12/1985 | Japan . |

OTHER PUBLICATIONS

J. Acoust. Soc. Am, vol. 62; No. 6, Dec., 1977 (pp. 1436–1441).

*Primary Examiner*—Forester W. Isen

[57] ABSTRACT

A sound reproducing apparatus is capable of reproducing a stereo or a voice signal and adding thereto effect sounds, such as an initial reflected sound, and reechoed sound during the reproducing. Each of the effect sounds is added with a delay time depending on a change of the sound source signal. To obtain the delay time, the sound source signal is converted into a three-value signal, and then the time in which the auto-correlation of the three-value signal decreases to a predetermined value is determined. Thus the effect sounds can be added automatically with a desired delay time due to the sound source signal. Therefore manual adjustments are unnecessary, and the circuit structures of the entire apparatus can be simplified.

17 Claims, 14 Drawing Sheets

| MEMORY 12 OUTPUT | MEMORY 13 OUTPUT | UP COUNT CLOCK | DOWN COUNT CLOCK |
|---|---|---|---|
| 0 | 0 | — | — |
| 0 | 1 | — | — |
| 0 | -1 | — | — |
| 1 | 1 |  | — |
| 1 | -1 | — |  |
| -1 | -1 |  | — |
| 1 | 0 | — | — |
| -1 | 0 | — | — |
| -1 | 1 | — |  |

SOUND REPRODUCING APPARATUS

BACKGROUND OF THE INVENTION

1. Field of the Invention

This invention relates to a sound reproducing apparatus such as a stereo reproducing apparatus and a voice reproducing apparatus, and more particularly to a sound reproducing apparatus in which an initial reflected sound and a reechoed sound can be added.

2. Description of the Related Art

FIG. 2 of the accompanying drawings illustrates a typical conventional apparatus for adding an initial reflected sound and a reechoed or reverberated sound. In FIG. 2, control signals are supplied to an initial reflective sound generator 3 and a reechoed sound generator 4 from a control signal generating unit 2 under the control of an operating unit 1. In an adder 5, the outputs of these two generators 3, 4 are added to a stereo signal inputted from an input terminal 6.

The operating unit 1 is composed of a plurality of adjusting knobs for adjusting a delay time of the initial reflected sound, an addition ratio, a delay time of reecho or reverberation, a reduction ratio, etc.; as the individual adjusting knob is turned, the resistance value of a variable resistor varies The initial reflective sound generator 3 is composed of a delay unit 3*a* for giving a delay time to a first initial reflected sound, a reducer 3*b* for giving a mixing ratio, another delay unit 3*c* for giving a delay time to a second initial reflected sound, and another reducer 3*d* for giving a mixing ratio. This illustrated example is the case in which a sound signal is a one-channel signal. Alternatively, in the sound signal could be a two-channel signal like a stereo signal. Designated by 7 is an output terminal from which a stereo signal or a voice signal is to be outputted.

In operation, a sound signal, i.e., one channel of a stereo signal inputted from the input terminal 6, is branched into two partial signals. One partial signal is delayed a predetermined time and is reduced at a predetermined rate in the initial reflective sound generator 3. The other partial signal is shaped into a reechoed sound having a predetermined delay time and a decay gradient by the reverberation generator 4. The individual reechoed signals processed in the initial reflective sound generator 3 and the reverberation generator 4 are added to the original sound signal at the adder 5 to form a composite signal, which is outputted from the output terminal 7.

At that time, for instance, when the user turns the delay-time-of-initial-reflected-sound adjusting knob at the operating unit 1, the resistance value of its associated variable resistor varies to create a voltage proportional to the resistance value. This voltage is inputted to the control signal generating unit 2. In the control signal generating unit 2, a control signal is given to the delay unit 3*a* which then generates a delay time control signal, depending on the voltage, to vary the delay time of the initial reflected sound, the mixing ratio of the initial reflected sound, and the decay time and the decay gradient of the reechoed sound. For setting an optional value, the user turns a correspond adjusting knob to vary the mixing ratio, the delay time, decay reduction gradient or other parameter.

Thus in the conventional apparatus, the user must to set the initial reflected sound and the reechoed sound by manipulating the various adjusting knobs by himself-/herself. The setting and adjusting of the initial reflected sound and the reechoed sound are made dependent upon the user's hearing while a sound source such as a music or a voice is being reproduced. During that time, the user must repeat attempted adjustments by trial and error; actually listening the sound source. Further, since the most preferred values of the initial reflected sound and the reechoed sound vary remarkably depending on the kind of a music, it is necessary to make an adjustment for each and every item of played music. When the adjustment is not proper, an instrument sound would be apparently doubled and is hence acoustically unnatural, thus giving an uncomfortable auditory impression to the listener.

According to some studies on acoustics, it is a common knowledge that a reflected sound and subsequent reflected sounds arriving behind a direct sound are significantly influential on the sense of hearing. In another acoustics study, a composite sound field, which is composed of a direct sound and a single reflected sound as a music and a voice are reproduced by a speaker, is evaluated in terms of preference (comfortability on the hearing sense of a human being). According to the principles of acoustics, when the level of a reflected sound was varied in the range of ±6 dB of a direct sound, upon having obtained the auto-correlation function $l\rho(\tau)$ of the regulated sound source signal, it was found that the most preferred delay time $|l_\rho(\tau)|$ of its reflected sound corresponded to a time equivalent to 1/10 of the level $A_1$ of the first reflected sound. FIG. 3 is a graph showing the relationship between the time $\tau_d$ (the x-axis), when this preference $|l_\rho(\tau)|$ is equivalent to 1/10 of the level $A_1$ of the first reflected sound, and the delay time $\tau_m$ (the y-axis) of the single reflected sound, when the preference is maximal. The illustrated range shows the delay time when the preference is lower than the maximal value by 0.1. In FIG. 3, a circle indicates $A_1=6$ dB; a dot, $A_1=0$ dB; a square, $A_1=-6$ dB. Specifically, assuming that the time in which $|l_\rho(\tau)|$ is 1/10 of $l_\rho(0)$ is called $\tau_e(0.1)$, $\tau_d=\tau_e(0.1)$ where $A_1=0$ dB. It is apparent from FIG. 3 that $\tau_d$ is very coincident with the delay time $\tau_m$ of the single reflected sound when the preference is maximal.

Further, it was reported that the auto-correlation function of a sound source also in a close connection with the most preferred reverberation time. The results of measurement are shown in FIG. 4, in which the x-axis is the above-mentioned $\tau_e(0.1)$ the y-axis is the central value $[T_{sub}]_d$ of the preferred reverberation time. Here "reverberation time" is defined as the time necessary until the signal of the reverberation part decreases to 60 dB, rather than the time in which the direct sound decreases by 60 dB. In FIG. 4, each of A, B and E indicates the case of a music, while S indicates the case of a voice; it is possible to obtain an approximation by the function $$[T_{sub}]_d \approx (23 \pm 10)\tau_e(0.1).$$

In the same method of measurement, the most preferred conditions, for the delay time of the second reflected sound in the sound field where two reflected sounds exist, was obtained as follows: The delay time of the first reflected sound is $\Delta t_1=20, 30, 40$ ms; the differential between the delay time of the second reflected sound $\Delta t_2$ and the delay time of the first reflected sound $\Delta t_1$ is $\Delta t_2-\Delta t_1=10, 20, 30$ ms; and these are combined. As a result of the same measurement of preference, preference curves shown in FIGS. 5(*a*) and 5(*b*) were obtained. FIG. 5(*a*) shows the preference curves as measured where the levels of the first and second reflected sounds were −4.2 dB and −6.2 dB, compared to the direct sound. FIG. 5(*b*) shows the preference curves as measured where the levels of the first and second reflected sounds were equal to the level of the direct sound. From FIGS. 5(*a*) and 5(*b*), it is apparent that if the delay time difference of the first and second reflected sounds $\Delta t_2 - \Delta t_1$ is about 0.8 times of the maximal delay time of the first reflected sound $[\Delta t_1]_p$, the preference is largest. Consequently it is understood that the most preferred delay time of the second reflected sound $[\Delta t_2]_p$ may be approximately expressed by the following equation:

$$[\Delta t_2]_p \approx 1.8[\Delta t_1]_p.$$

In the foregoing conventional apparatus, the most preferred delay time of the initial reflected sound, the most preferred reverberation time, etc. can be obtained from the auto-correlation of the sound source signal. Generally, however, a great amount of calculation is necessary to calculate the auto-correlation, and therefore it is difficult to finish the calculation within a practical time in a public welfare equipment such as a stereo reproducing apparatus.

SUMMARY OF THE INVENTION

It is therefore an object of this invention to provide a sound reproducing apparatus in which the auto-correlation of a sound source can be calculated in a short time and in which the most preferred delay time of an initial reflected sound and the most preferred reverberation time can be set without the user's assistance.

According to this invention, there is provided a sound reproducing apparatus comprising: a three-value signal converter circuit for converting a sound source signal into three-value signals of 1, 0 and −1; an auto-correlation calculating circuit for calculating an auto-correlation value by using the three-value signals; an envelope curve extractor circuit for approximating the auto-correlation value rectilinearly to obtain an envelope curve; a delay time detector circuit for detecting a delay time in which the envelope curve decreases to a predetermined ratio; and means for adding an effect sound to the sound source signal according to the delay time.

In the three-value signal converter circuit of this invention, the momentary absolute value of the sound source signal is compared with a predetermined threshold value and is converted into three-value signals of 1, 0 and −1. Further, in the auto-correlation calculating circuit, the auto-correlation value is calculated by using the three-value signals. In the envelope curve extractor circuit, the functional envelope curve is obtained from the rectilinear approximation of the auto-correlation value, and in the delay time detector circuit, the delay time in which the envelope curve decreases to a predetermined ratio is detected.

The above and other advantages, features and additional objects of this invention will be manifest to those versed in the art upon making reference to the following detailed description and the accompanying drawings in which a structural embodiment incorporating the principles of this invention is shown by way of illustrative example.

DETAILED DESCRIPTION

According to a recent study of acoustics, using three-valued zero-crossing signals is an effective method of simply analyzing a auto-correlation function. In this method, a preliminary processing expressed by the following equation is conducted over a sound source signal.

$$c[x(n)] = \begin{cases} 1(x(n) > 0) \\ 0(x(n) = 0) \\ 1(x(n) < 0) \end{cases}$$

where x(n) stands for an amplitude value of the sound source signal.

Figure 6A:
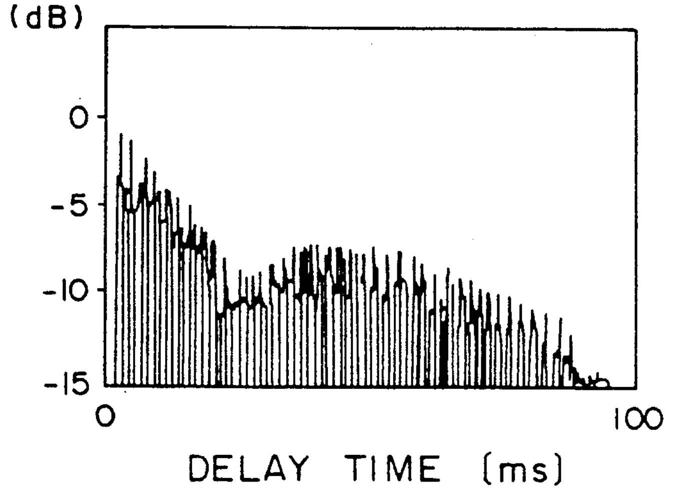
FIGS. 6(*a*) and 6(*b*) are graphs showing the calculated results of a auto-correlation function.
Figure 6B:
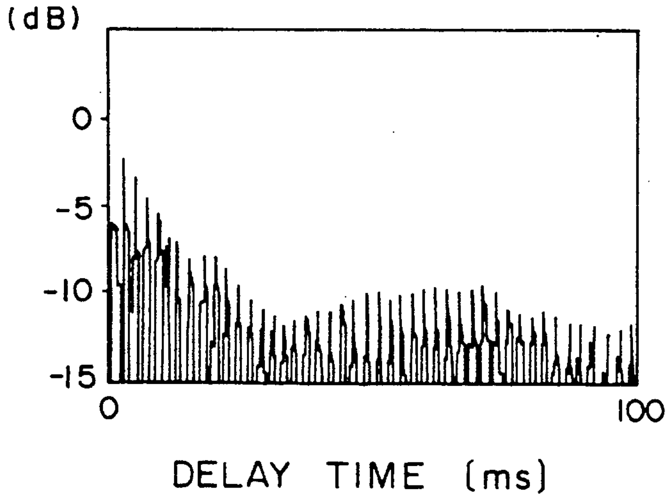

After the above-mentioned preliminary processing, the auto-correlation function is calculated. At that time, since all data are converted into three values of 1, 0 and −1, only adding may be necessary so that high-speed calculation can be achieved. The calculated results of the auto-correlation function obtained by this zero crossing method and precise calculation are shown in FIGS. 6(*a*) and 6(*b*). In FIGS. 6(*a*) and 6(*b*), the calculated signal was a music signal, and the auto-correlation was obtained with an integral section of two seconds. FIG. 6(*a*) shows the example in which the precise calculation was conducted, and FIG. 6(*b*) shows the example in which the calculation was performed according to the zero crossing. In either example, the delay time is such that the initial reduction gradient of an envelope curve of the auto-correlation is rectilinearly approximated to provide 0.1 (−10 dB), thus causing a common result. Accordingly, obtaining the most preferred delay time from the auto-correlation for two seconds is an effective method.

Another acoustics study has been made to find a suitable length for the time window in calculating the most suitable delay time which varies time to time in a sound source such as a music and/or a voice. In this study, the auto-correlation was obtained by the cross-spectrum method according to FFT (Fast Fourier Transform). The results of this experiment show that the suitable window is in the range of 500 ms to 2 s. Consequently, by calculating the auto-correlation as this time window is varied in 100 ms, it is apparently possible to obtain the most preferred delay time of the initial reflected sound and also the most preferred reverberation time, which vary time to time.

Further, as mentioned above, the most preferred delay time in reproducing by a speaker can be obtained from the time in which the auto-correlation decreases to 0.1. In reproducing by an earphone, the time in which the auto-correlation decreases to 0.25 suitably agrees with the most preferred time. In reproducing by a headphone, the time in which it decreases to 0.25±0.08 is suitably enough for the most preferred delay time.

Figure 1:
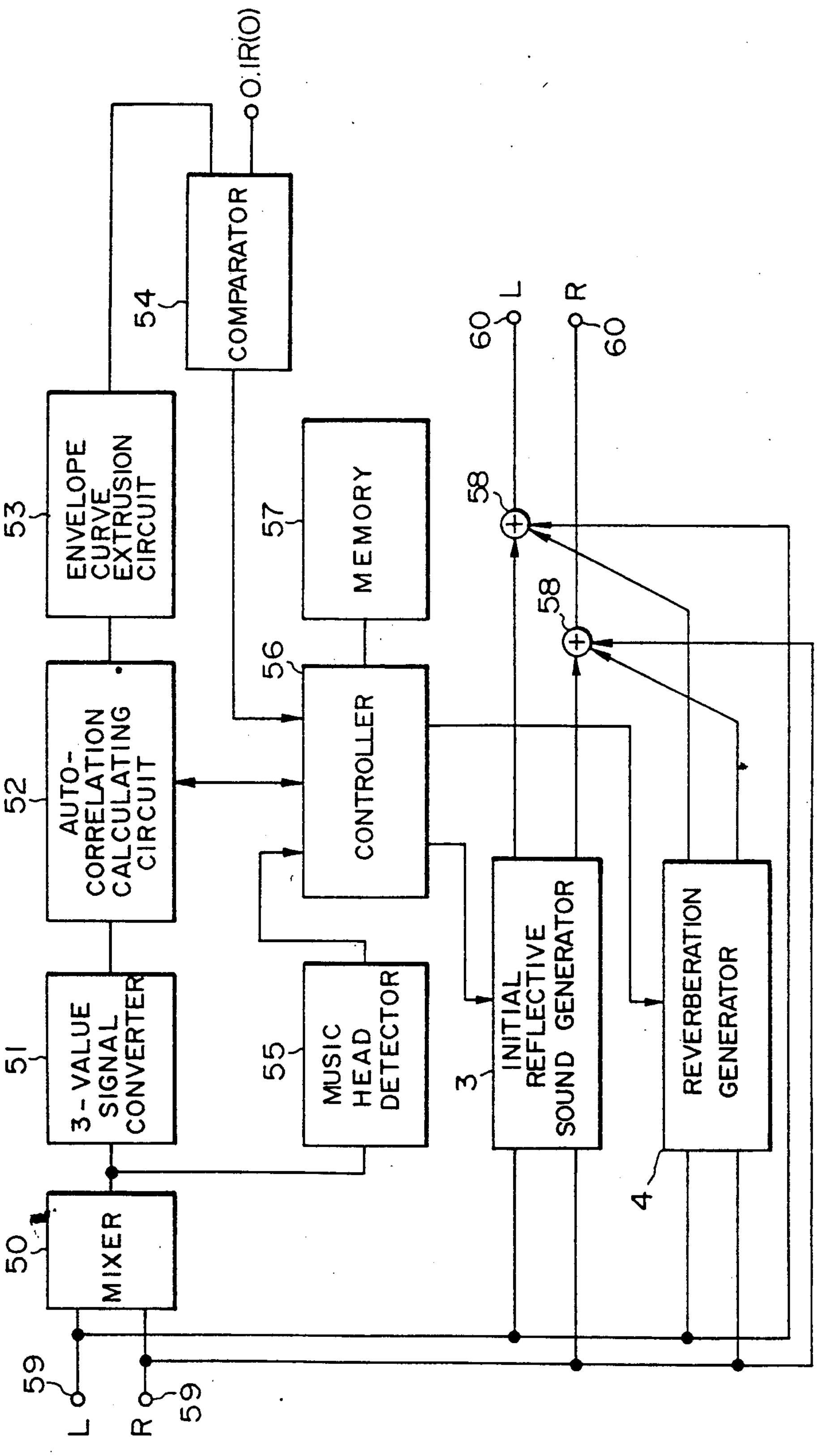
FIG. 1 is a block diagram showing a sound reproducing apparatus embodying this invention.
Figure 2:
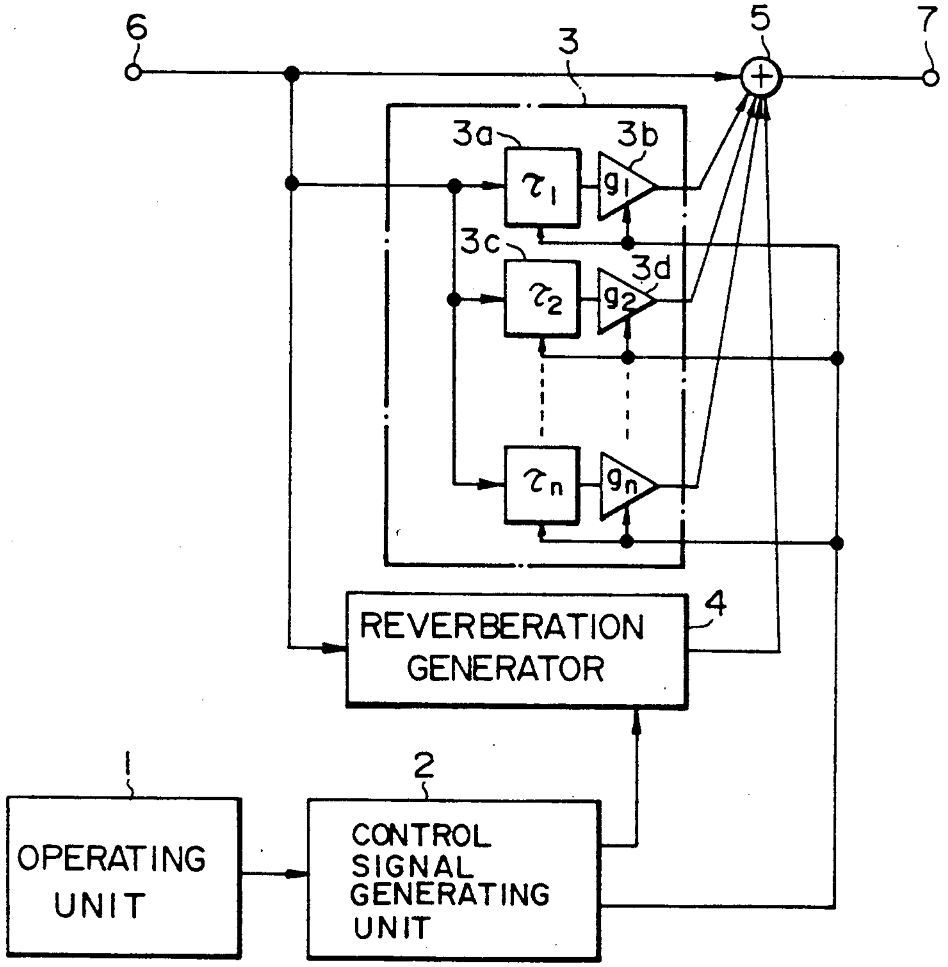
FIG. 2 PRIOR ART
FIG. 2 is a block diagram showing a conventional apparatus.
Figure 3:
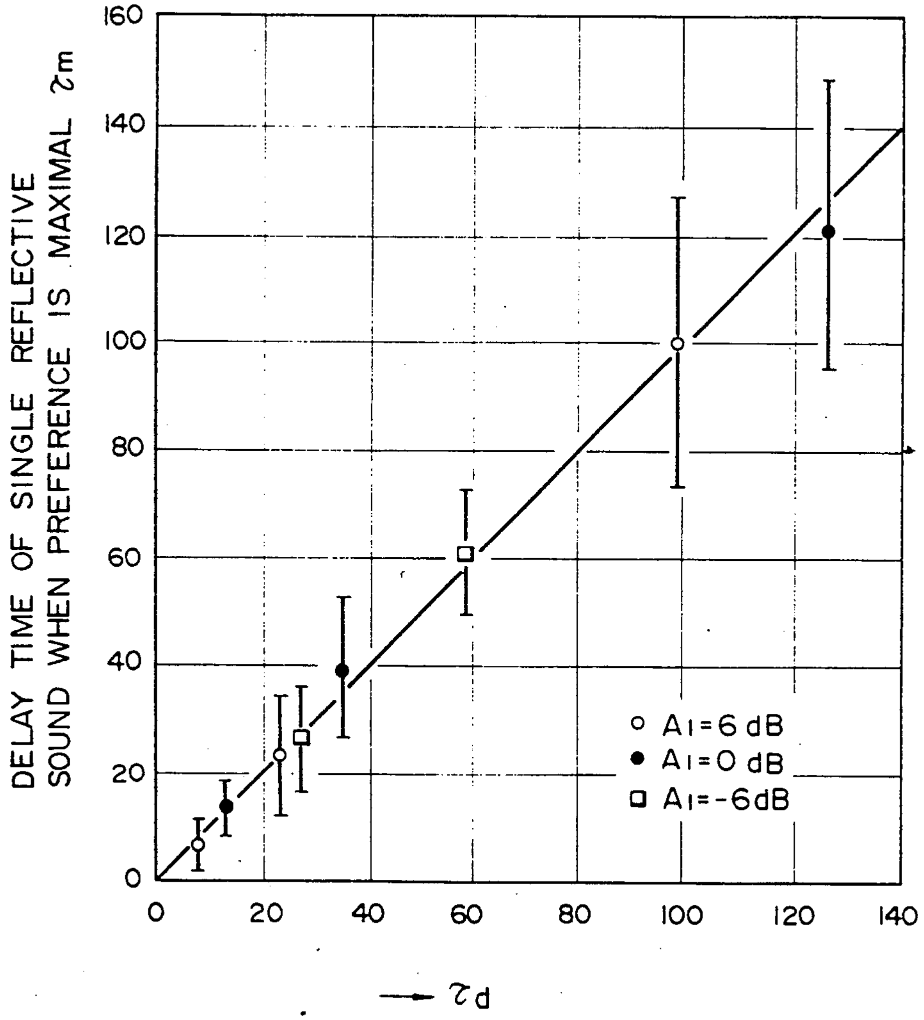
FIG. 3 is a graph showing the relation between a delay time, when this a auto-correlation is equivalent to 1/10 of the level of a first reflected sound, and a delay time of a single reflected sound, when a preference is maximal.
Figure 4:
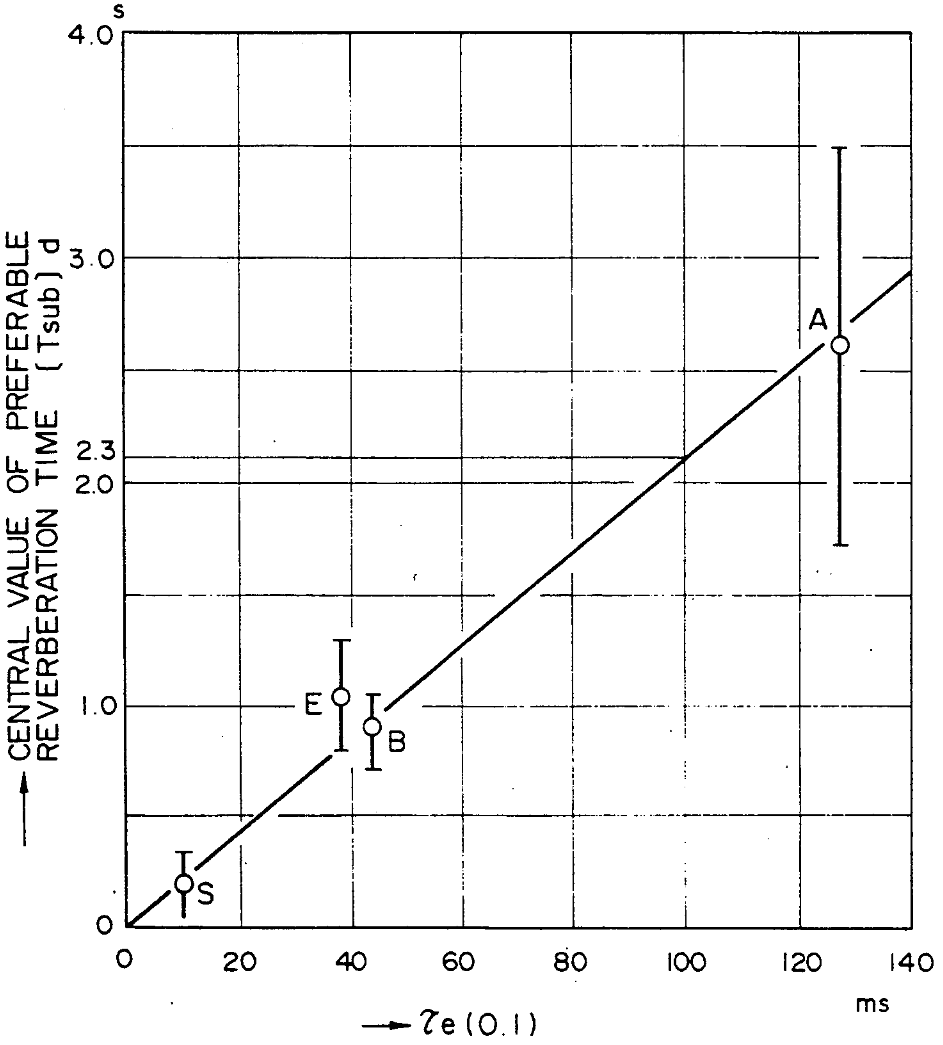
FIG. 4 is a graph showing the relation between a time in which a auto-correlation function is equivalent to 1/10 of 0 dB of the first reflected sound, and a central value of the preferred reverberation time.
Figure 5B:
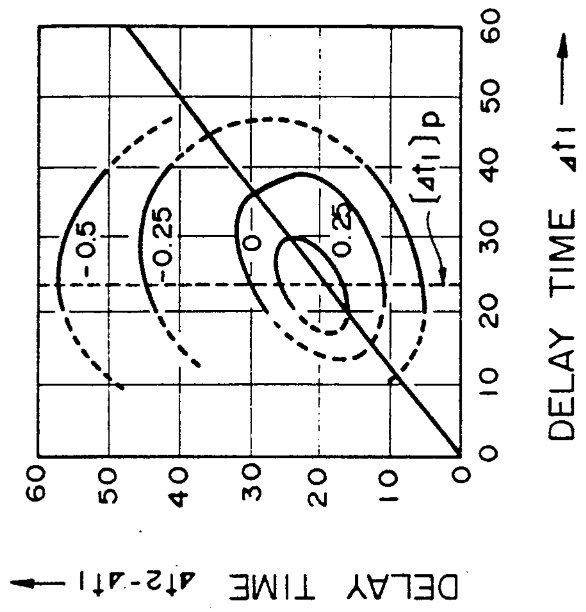
FIGS. 5(*a*) and 5(*b*) are graphs showing contour lines of equal preference.
Figure 5A:
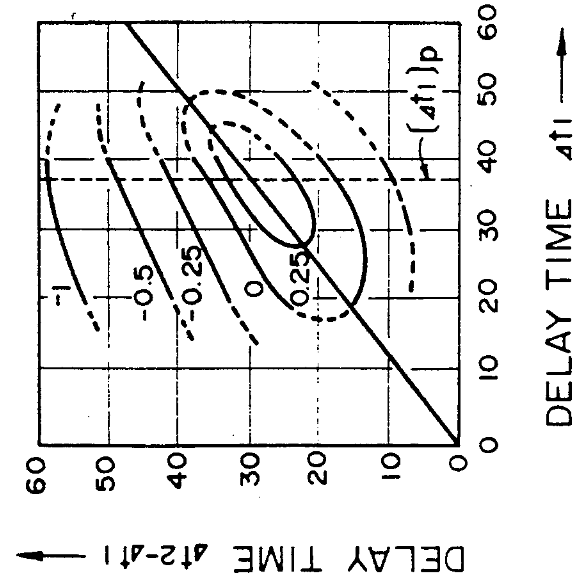

The principles of this invention are particularly useful when embodied in a sound reproducing apparatus (hereinafter called "apparatus") such as shown in FIG. 1. Here the apparatus is a stereo reproducing apparatus, for example, for the purpose of explanation.

As shown in FIG. 1, the apparatus generally comprises a mixer circuit 50, a three-value signal converter circuit 51 for converting a mixed stereo signal into three-value signals of 1, 0 and −1, a auto-correlation calculating circuit 52 for calculating an auto-correlation from the three-valued signals, an envelope curve extractor circuit 53 for obtaining from the auto-correlation value its envelope curve, a comparator 54 for comparing the envelope curve with a predetermined reference value and for outputting the results of the comparison, a music head detector circuit 55 for detecting the start point of a stereo signal, a controller 56, a memory 57 for storing three-value signals, and an adder 58. Designated by 59 and 60 are an input terminal and an output terminal, respectively.

Figure 7:
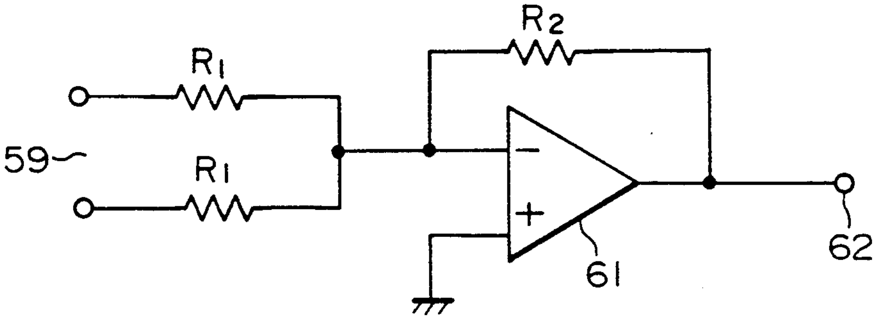
FIG. 7 is a circuit diagram showing a mixer circuit of the apparatus of this invention.

In operation, stereo signals L, R of left and right channels, inputted from the input terminal 59, are added to provide a monaural signal in the mixer circuit 50. The mixer circuit 50 may be in the form of a circuit shown in FIG. 7, in which 61 designates an operational amplifier; 62, an output terminal; $R_1$, $R_2$, resistors. The mixed stereo signals are inputted to the music head detector circuit 55. The music head detector circuit 55 is composed of a demodulating circuit, a time constant or integration circuit, a comparator, etc. Alternatively, these circuit functions may be integrated on a single semiconductor chip to form an IC. In this IC, as a reduction start signal is inputted to an input terminal, the reproducing operation starts and, at the same time, the operation of detecting the head of a music starts, thus enabling a reliable detection of the music head. Effect sounds are added to each and every music independently of each other music; any effect sounds which have been previously set for the preceding music will be canceled, and then another set of effect sounds will be set for a succeeding music.

This IC includes a function of adjusting the music head detection level. In stereo reproducing apparatuses, even in those of analog type using a compact cassette, the signal-to-noise ratio is at least 40 odd dB, and the residual noise of the reproducing apparatus is less than −40 dB. If the music head detection level is set larger than an effective value of the residual noise, e.g., more than twice the effective value, it is possible to detect the starting point of a music correctly without any misdetection due to the residual noise. In a digital-type stereo reproducing apparatus such as a CD player, since the noise level is smaller than in the analog type reproducing apparatus, no misdetection due to the noise would occur even if the detection level is same as in the analog type reproducing apparatus.

Meanwhile, the stereo signals mixed by the mixer circuit 50 are also inputted to the three-value converter circuit 51 where they are converted into three values by real time. Conversion of the three values into zero cross signals is conducted under the conditions expressed by the following equation. Assuming that the three-value signals converted from the sound source signal x (t) is c [x (t)], $$c[x(t)] = \begin{cases} 1(x(t) > \Delta x) \\ 0(|x(t)| < \Delta x) \\ 1(x(t) < -\Delta x) \end{cases}$$

where x (t) is a peak value of the sound source signal, and Δx (>0) is a threshold value. Preferably, this threshold value Δx is sufficiently smaller than the maximal peak value of the sound source signal, and is larger than the residual noise level of the stereo reproducing apparatus.

Figure 8:
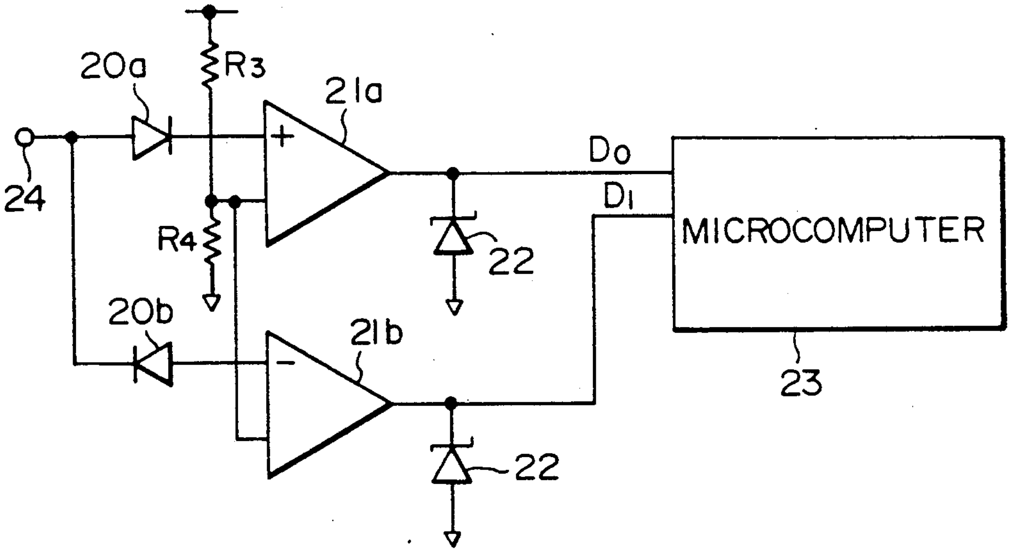
FIG. 8 is a circuit diagram showing a three-value signal converter circuit of the apparatus of this invention.

FIG. 8 shows one example of the three-value signal converter circuit 51. As shown in FIG. 8, the three-value converter circuit 51 is composed of an input terminal 24, a pair of diodes 20*a*, 20*b*, a pair of resistors $R_3$, $R_4$, a pair of comparators 21*a*, 21*b*, a pair of Zener diodes 22, and a microcomputer 23. The composite signal inputted from the input terminal 24 is separated into positive and negative by the diodes 20*a*, 20*b* and is then inputted to the comparators 21*a*, 21*b*. The comparators 21*a*, 21*b* compares the composite signal with the threshold value Δx which is determined by the ratio of the resistors $R_3$, $R_4$. When the composite signal is positive and has an absolute value larger than Δx, the output of the comparator 21*a* is high level. When the composite signal is negative and has an absolute value larger than Δx, the output of the comparator 21*b* is high level. Expressing the three-value signals in ($D_1$, $D_0$), the composite signal is converted, by the three-value signal converter circuit 51, into three values: "+1"=(0, 1); "0"=(0, 0); and "−1"=(1, 0). Though there is no illustration in the drawings, this conversion is performed in synchronism with conversion clocks. The conversion clocks may be generated by another independent circuit or may be created softwarewise by a program of the microcomputer 23. The thus converted three-value signals are fetched by the microcomputer 23 in synchronism with the conversion clocks.

The sound source signal, having been converted into three-value signals by the three-value signal converter circuit 51, is inputted to the auto-correlation calculating circuit 52 where the correlation is calculated in the following equation. Specifically, assuming that the i-th three-value signal is $C_i$, its absolute is $A_i$, and a sign is $S_i$, the following logical operation is conducted for the absolute bit, representing the absolute value, and the sign bit:

The peak bit is $A_i$, $k=A_i \cdot A_{i+k}$, and the sign bit is $S_i$, $k=S_i+S_{i+k}$, where k is a delay time. Therefore, the auto-correlation value is calculated by the equation:

$$R(k) = \sum_{i=0}^{N} (S_{i,k}, A_{i,k}).$$

Assuming that a sampling frequency to be converted into the three-value signal by the three-value signal converter circuit 51 is $f_s$, N in an integral section of 2 seconds is $N=2f_s$.

Figure 9:
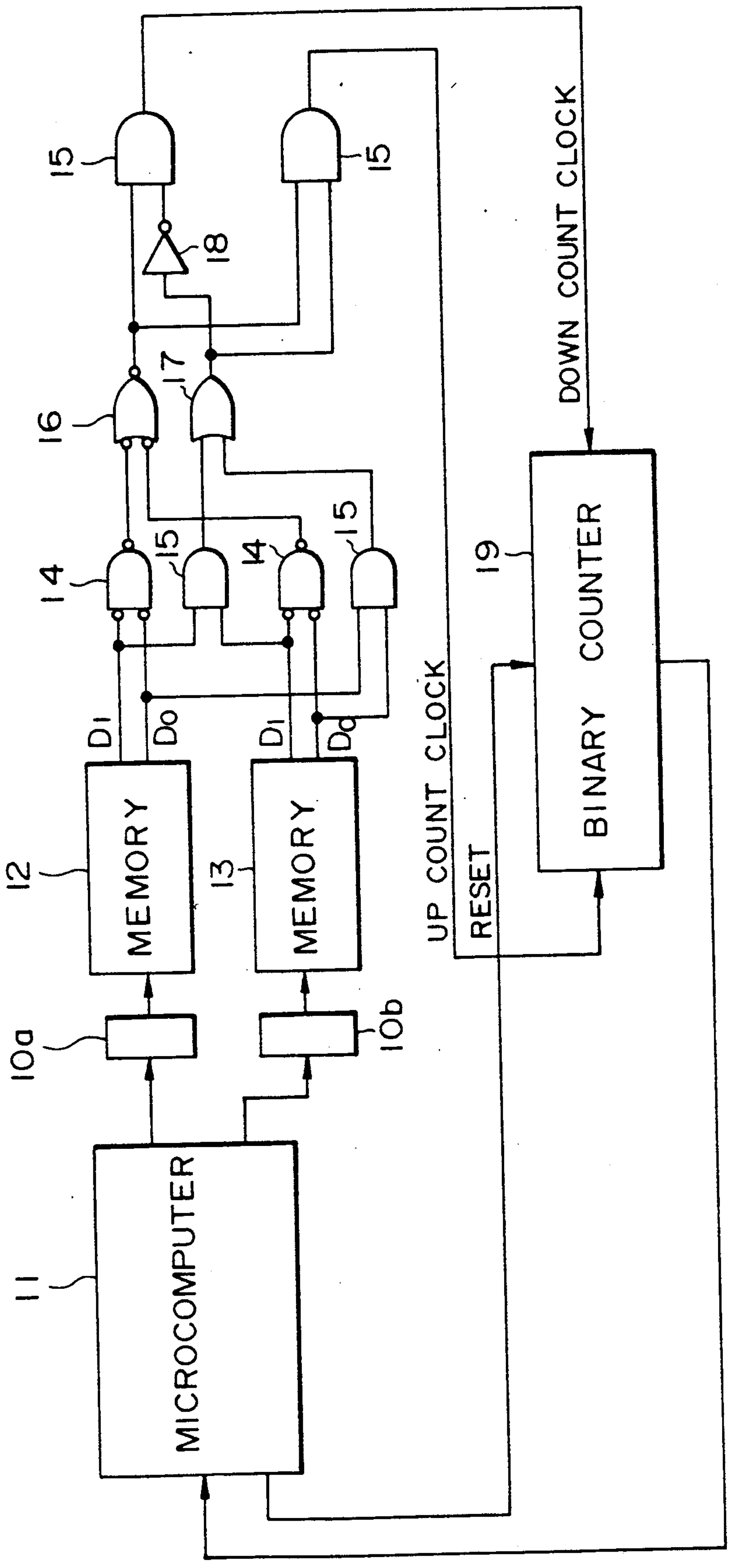
FIG. 9 is a circuit diagram showing an auto-correlation calculating circuit of the apparatus of this invention.

FIG. 9 shows one example of the auto-correlation calculating circuit 52, along with the controller 56 and the memory 57. The auto-correlation calculating circuit 52 is composed of a microcomputer 11, a pair of memories 12, 13 for storing the three-value signals therein, a NAND element 14, an AND element 15, a NOR element 16, an OR element 17, an inverter 18, a binary counter 19, and a pair of address counters 10*a*, 10*b*.

Figure 16:
FIG. 16 is a table showing the mode of operation of the auto-correlation calculating circuit of FIG. 9.
Figure 16:
Figure 16:
Figure 16:
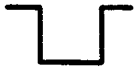

The operation of the auto-correlation calculating circuit 52 will now be described. The three-value signals converted by the sampling frequency $f_s$ are stored successively in the memories 12, 13. The contents of storage are identical, but with successive lags in storing order. If the three-value signals of 2 seconds are stored in the memories 12, 13, the auto-correlation is calculated as the three-value signals are successively read. Firstly, the microcomputer 11 resets the binary counter 19. Then address data are transferred the address counter 10*a* from the microcomputer 11, and the address of the memory 12 is set to the leading address of the stored three-value signals. Likewise, the address of the memory 13 is set to the leading address of the three-value signals. From the respective memories 12, 13, the $D_1$ bit and the $D_2$ bit of the first three-value signal $C_0(D_1, D_0)$ are read so that a logical operation is conducted by the NAND element 14, the AND element 15, the NOR element 16, the OR element 17 and the inverter 18. For example, if the three-value signal $C_0(D_1, D_0)$ is +1, namely, if $(D_1, D_0)=(0, 1)$, the up count clock is low level, and the down count clock remains unchanged. As a result, the contents of the binary counter 19 is counted up only by 1. If the three-value signal $C_0(D_1, D_0)$ is 0, namely, if both the $D_1$ bit and the $D_0$ bit are 0, no counting operation is performed. The results of the logical operation by the three-value signals read from the memories 12, 13 are shown in FIG. 16.

Upon completion of the logical operation of the three-value signal $C_0$, the individual addresses of the memories 12, 13 are increased by an increment, and the three-value signal $C_1$ is read from the memories 12, 13. Then a logical operation is performed as shown in FIG. 16. As the foregoing operations are repeated with respect to the three-value signals of 2 seconds, the correlation value R (0), where the delay time is 0, is calculated by the binary counter 19 so that the microcomputer 11 fetches the correlation value R (0). Then the microcomputer 11 resets the binary counter 19, transfers address data to the address counter 10*a*, and sets the address of the memory 12 to the address of the three-value signal $C_0$. And the address of the memory 13 is set to the address of the three-value signal $C_1$ one behind the first three-value signal. As addresses of the memories 12, 13 are incremented, the logical operation of FIG. 16 is carried out orderly to calculate the correlation value R(1) when the delay time k (constant) is 1. This is to be repeated in the following. With the binary counter 19 reset for each on every calculation and with the initial address of the memory 13 delayed one by one, the correlation values R(k) are calculated where k is 0, 1, 2, . . . Because three-value signals require 2 bits per three-value signal, the capacity of each of the memories 12, 13 is 22.1 Kbytes, for enough memory when the frequency to be converted is 44.1 KHz.

Description is omitted here about a clock generator circuit for generating a clock for address increment, and also circuits for generating a clock and a control signal to operate the microcomputer 11. However conventional circuits may be used for these circuits. The clock indicative of the operation timing is of course preferably to be set such that the addresses of the memories 12, 13 are latched, and the logical operation is conducted while the read data remain unchanged, and the counter is operated.

The operation of the envelope curve extractor circuit 53 will now be described. This circuit 53 is a circuit for approximately obtaining an envelope curve of the auto-correlation function calculated by the auto-correlation calculating circuit 52. Here the example in which an envelope curve is simply extracted without using a multiplier will be explained. In this example, an arithmetical mean of $2^m$(m is 1, 2, . . . ,) number of the auto-correlation values is obtained. The line extending the arithmetical mean value and the auto-correlation value R(0) is an approximate line for the envelope curve of the auto-correlation function, and m=2 for example.

Figure 10:
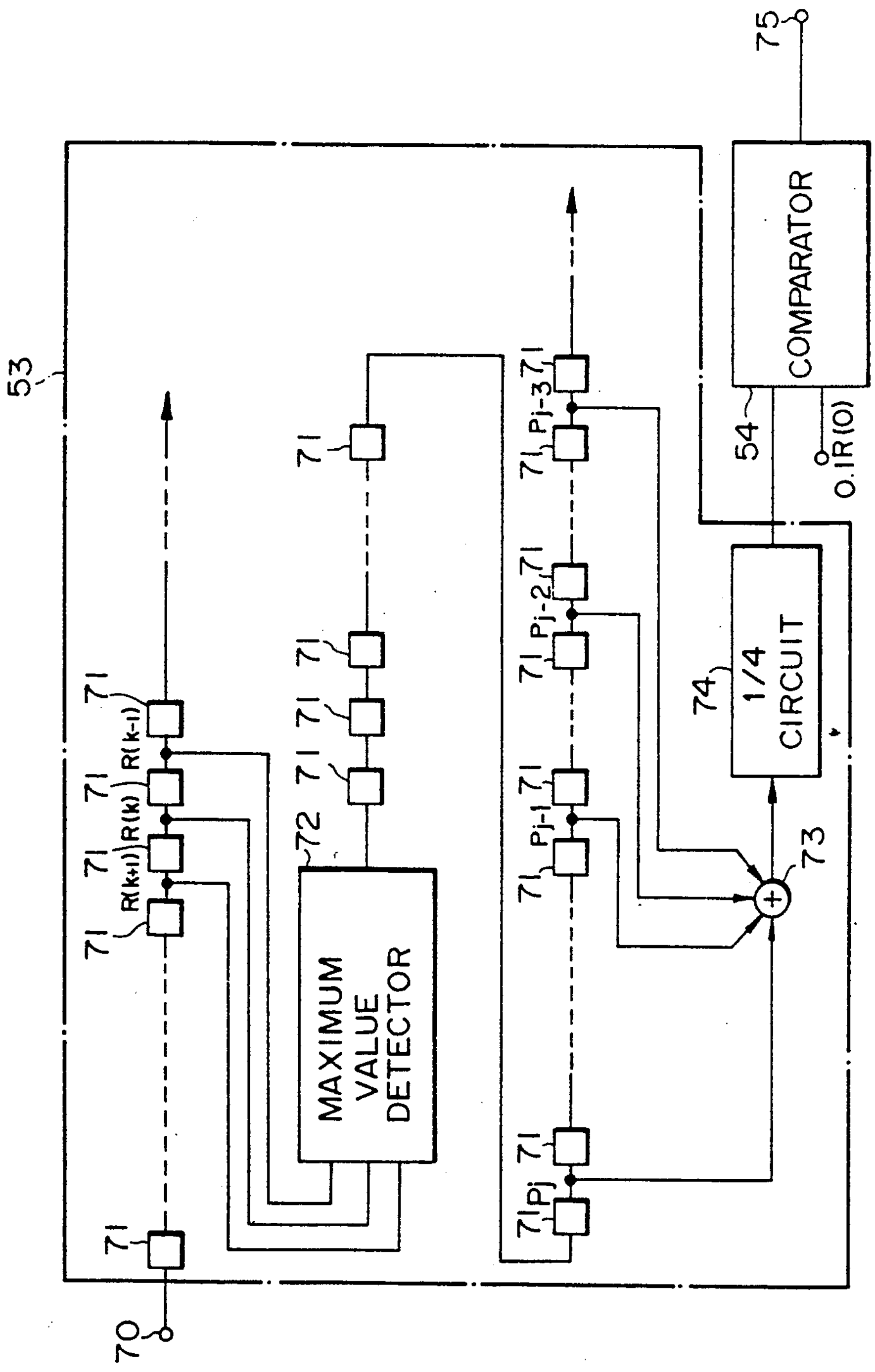
FIG. 10 is a block diagram showing an envelope curve extractor circuit of the apparatus of this invention.

FIG. 10 shows the detail construction of the envelope curve extractor circuit 53. As shown in FIG. 10, the envelope curve extractor circuit 53 is composed of a comparator 54 for comparing an approximate value of the envelope curve with a predetermined value, an input terminal 70, a delay element 71 having a single sample block to demonstrate the sequentiality, a known maximal value detector circuit 72, an adder 73, a ¼ circuit 74, and an output terminal 75 from which the results of comparison are outputted. R(k−1), R(k) and R(k+1) are auto-correlation values, and $P_{j-3}$ through $P_j$ are maximal values. In operation, as the auto-correlation values calculated in order by the auto-correlation calculating circuit 52 are inputted from the input terminal 70, the maximal value detector circuit 72 discriminates whether they are $|R(k)|>|R(k-4)|$ and $|R(k)|>|R(k+1)|$. If they satisfy this condition, the maximal value detector circuit 72 outputs R(k) with the maximal value $P_j$. The maximal values $P_{j-3}$ through $P_j$ outputted sequentially from the maximal value detector circuit 72, are added in the adder 73 and are multiplied by ¼ in the ¼ circuit 74 to thereby obtain an arithmetical mean value. Since this ¼ multiplying corresponds to the 2-bit rightward shifting with respect to the positive digital value, the ¼ circuit 74 can be easily realized by a known device. The arithmetical mean value outputted from the ¼ circuit 74 is compared with 1/10 of the auto-correlation value R(0) by the comparator 54. If it is larger than 0.1 R(0), "0" is outputted from the comparator 54; if it is less than 0.1 (0), "1" is outputted. Thus successive arithmetical means are obtained by using the maximal values $P_{j-3}$ through $P_j$ in order with respect to i=3, 4, 5, . . . , and are compared with the reference value 0.1 R(0). If it is less than 0.1 R(0), "1" is outputted from the comparator 54. Thus it is found that an approximate value of the envelope curve of the auto-correlation function is less than the predetermined reference value. As mentioned above, by using the arithmetical mean of $2^m$(m=1, 2, . . . , ) number of the auto-correlation values, it is possible to obtain mean values by shifting with respect to digital values, thus extracting an approximate value of the envelope curve without using a multiplier.

When the output of the comparator 54 is "1", the controller 56 calculates the most suitable delay time $(\tau_{j-3}+\tau_{j-2}+\tau_{j-1}+\tau_j)/4$, which becomes 0.1 R(0), by the arithmetical mean from the delay time $\tau_{j-3}$ through $\tau_j$ of the maximal value $P_{j-3}$ through $P_j$. Further, the controller 56 sends to the initial reflected sound generator circuit 3 and the reverberation generator circuit 4, a control signal for setting the most preferred delay time of the initial reflected sound and also the most preferred reverberation time, from the calculated most preferred delay time, thereby giving the most suitable effect to the original stereo signal. According to the above-mentioned study on acoustics, if the most preferred delay time $\tau_d$, it is preferable that the most preferred delay time of the first reflected sound is $\tau_1=\tau_d$, and the preferred delay time of the second reflected sound is $\tau_2=1.8\ \tau_d$. In this illustrated embodiment, the integral section in which the auto-correlation is to be calculated is 2 seconds. It is also apparent from the above-mentioned recent study that the similar results can be obtained also when the integral section is within the range of 500 ms to less than 2 seconds.

Figure 11:
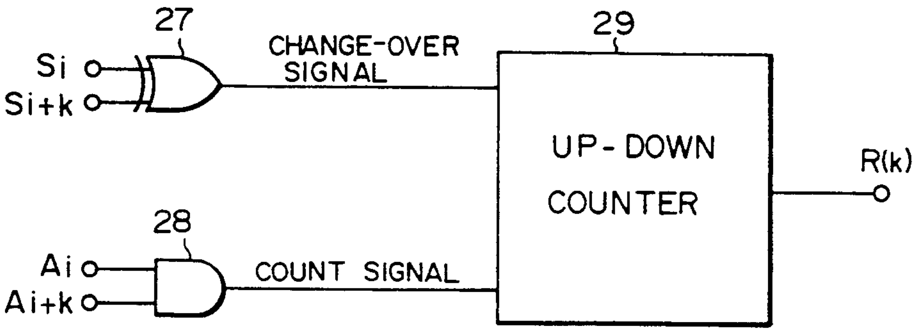
FIGS. 11 and 12 are block diagrams showing modifications of the auto-correlation calculating circuit of the apparatus of this invention.

FIG. 11 shows a modification of the auto-correlation calculating circuit 52, illustrating the manner in which the correlation of two three-value signals ($S_i$, $A_i$) and ($S_{i+k}$, $A_{i+k}$) are calculated. The modified calculating circuit 52 is composed of an exclusive OR circuit 27 for performing a logical operation of the sign bits, an AND circuit 28 for performing a logical operation of the absolute bits, and an up/down counter circuit 29 for taking an increment if the converted signal is "0", and a decrement if the converted signal is "1". $S_i$ is the i-th code bit, and $A_i$ is the i-th absolute bit. Hereinafter the three-value signals are assumed as +1=(0, 1), 0=(0, 0), −1=(1, 1). Now the example in which the i-th three-value signal ($S_i$, $A_i$) and the (i+k)-th three-value signal ($S_{i+k}$, $A_{i+k}$) are inputted will considered. If these two signals are "1", the logical exclusive OR of the sign bits $S_i$ and $S_{i+k}$ will be "0", and its output, i.e., the converted signals also will be "0". Consequently the up/down counter circuit 29 is set so as to take an increment. Because the arithmetical results of the absolute bits $A_i$ and $A_{i+k}$, its output, namely, the count signal will be "1"; in which case the counter value of the up/down counter circuit 29 takes an increment. If the i-th three-value signal is "1", and the (i+k)-th three-value signal is −1, the converted signal will be "1" after the arithmetical operation of the sign bit so that the counter value takes a decrement If the i-th and/or the (i+k)-th three-value signals is "0", the arithmetical results of the absolute bit will be "0" so that the counter signal will be "0", thus causing the up/down counter circuit 29 to perform no counting operation After having reset the up/down counter circuit 29, such operation is made with respect to the three-value signal of 2 seconds from i=0 to i=2N. Accordingly the k-th auto-correlation value R(k) is calculated.

Figure 12:
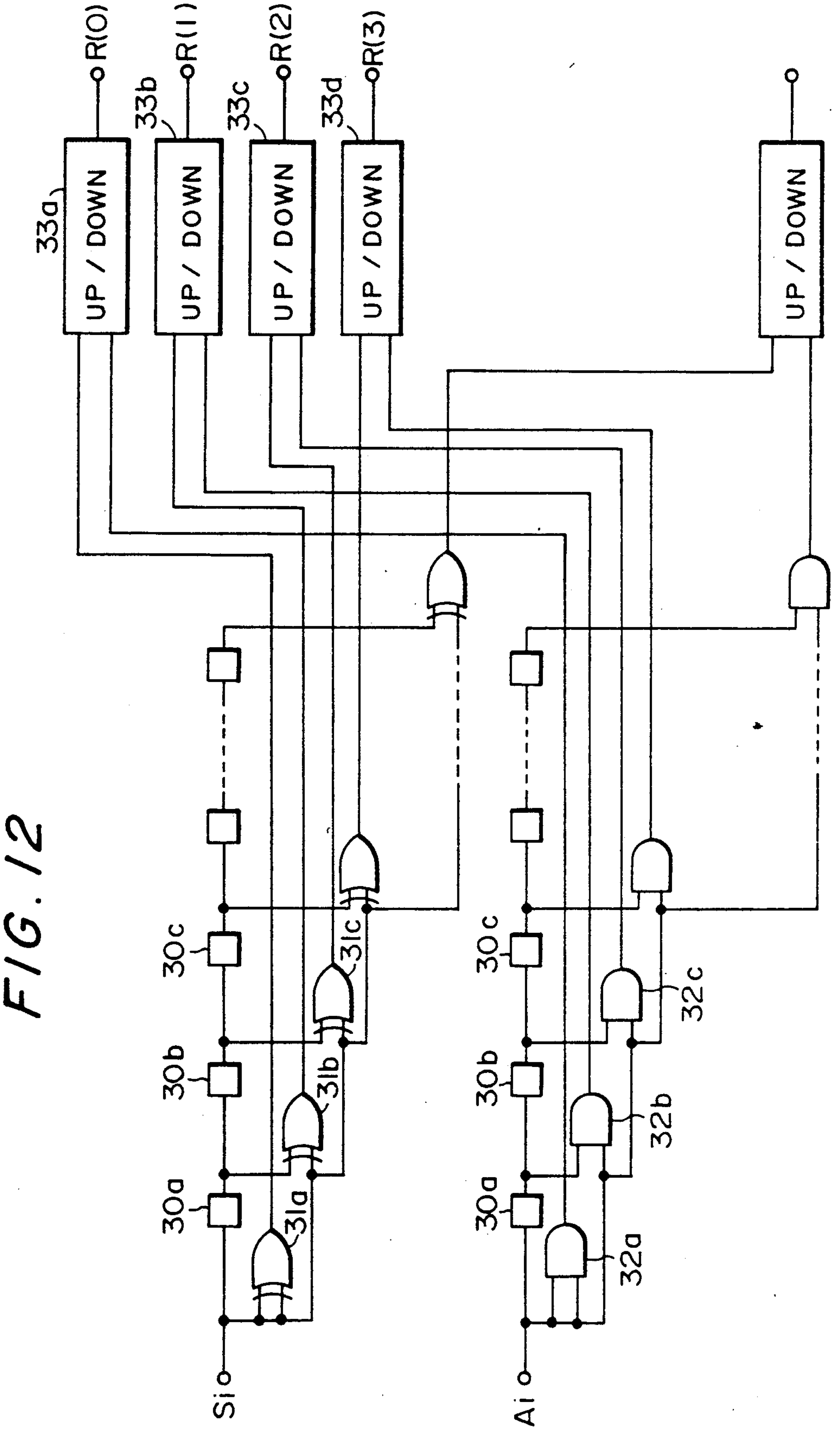

FIG. 12 shows another modification of the auto-correlation calculating circuit 52 in which the auto-correlation value of 2 seconds is calculated. This auto-correlation calculating circuit 52 is composed of delay elements 30*a*, 30*b*, . . . , for delaying one sample clock, exclusive OR circuits 31*a*, 31*b*, . . . , for performing an arithmetical operation of the sign bit, AND circuits 32*a*, 32*b* for performing an arithmetical operation of the absolute bit, and up/down counter circuits 33*a*, 33*b*, . . . . Apart from the delay elements 30*a*, 30*b*, . . . , each of the other circuits has the same function as the corresponding circuit of FIG. 11. In operation, the individual up/down counter circuits 33*a*, 33*b*, . . . , are reset before starting the counting operation. Then as the counting operation starts, the first three-value signal (i=0) is inputted so that the sign bit $S_{is}$ itself and the exclusive OR condition are taken by the first exclusive OR circuit 31*a*. Thus the up/down counter circuit 33*a* takes an increment. Meanwhile, the absolute bit $A_i$ itself and the AND condition are taken by the first AND circuit 33*a*, and depending on the arithmetical results, the up/down counter circuit 33*a* takes the counting operation.

Then when the second three-value signal (i=1) is inputted, the above-described logical operations are performed in the exclusive OR circuit 31*a* and the AND circuit 32*a*, and the auto-correlation value R(0) is calculated by the up/down counter circuit 33*a*. Also, the exclusive OR circuit 31*b* performs an arithmetical operation of the sign bit of i=0 and the sign bit of i=0, and the AND circuit 32*b* performs an arithmetical operation of the absolute bits of i=0 and i=1. According to the arithmetical results, the up/down counter circuit 33*b* takes the counting operation. For the third three-value signal (i=2), the exclusive OR circuits 31*a* through 31*c* and the AND circuits 32*a* through 32*c* perform arithmetical operations, and the up/down counter circuits 33*a* through 33*c* take the counting operations. As the three-value signals are successively inputted, the up/down counter circuits 33*a*, 33*b*, . . . , take the successive counting operations to thereby calculate the auto-correlation values R(0), R(1), . . . . In this illustrated example, the three-value signals $C_i(S_i, A_i)$ are +1(0, 1), 0=(0, 0) and 1=(1, 1), where $S_i$ is a sign bit, and $A_i$ is an absolute bit. They may be obtained as the microcomputer codes, as (1, 1), the three-value signal obtained from the three-value signal converter circuit 51 of FIG. 8, only in the case of (0, 0). Alternatively, it may be assumed that $A_i=D_0+D_1$ and $S_i=D_1$ as an OR element is added. In another alternative form, the delay elements 30*a*, 30*b*, . . . , delayed one sample behind one another may be serial-input and parallel-out shift registers. Further, the memories and their addresses may be address counters which take an increment or a decrement.

A modification of the delay time detector circuit will now be described which rectilinearly approximates an envelope curve of the auto-correlation function to obtain the most preferred delay time that the approximate envelope curve decreases to a predetermined ratio. Since the most preferred delay time is obtained from the reduction gradient of envelope curve of the auto-correlation, the maximal point is obtained by the following equation. If the j-th maximal value is $P_j$, $P_j=|R(kj)|$, where $$|R(kj)|R(k_{j-1})|>0, \text{ and}$$

$$|R(k_{j+1})|-|R(k_j)|<0.$$

Figure 13:
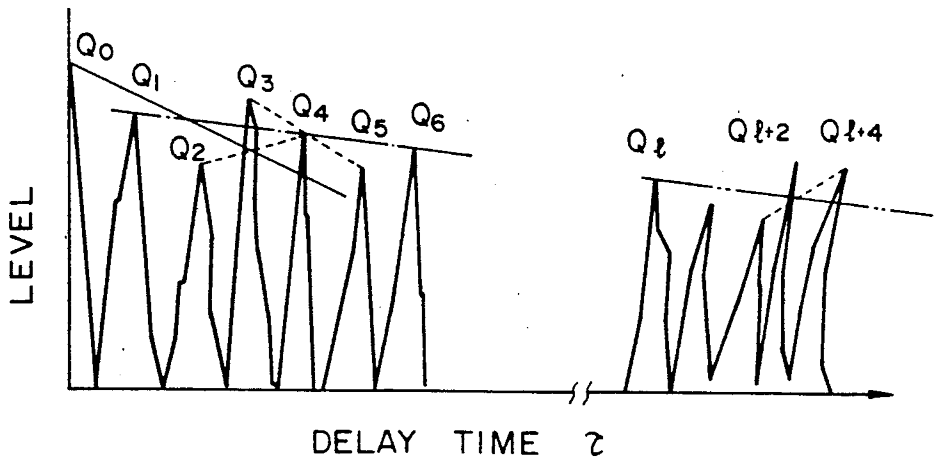
FIG. 13 is a detail graph showing the log-converted auto-correlation around the origin.

Thus the maximal point can be obtained by a relatively small amount of calculation. Of various ways of obtaining the reduction gradient from the maximal point, here the method of presuming a gradient by a rectilinear approximation from the log-converted value will be described. By reading a corresponding converted value from a ROM in which converted values of estimate figures are stored beforehand, it is possible to take a log conversion in a short time. Here in the following description, the log-converted value of the maximal value $P_j$ is $Q_j$. FIG. 13 is a detail graph showing the log-converted auto-correlation around the origin. The y-axis shows the correlation value, and the x-axis shows the delay time $\tau$; $Q_0$, $Q_1$, . . . , are the values log-converted from the maximal values. Assuming that the value log-converted from the l-th maximal value is $Q_l$, the most preferred delay time that the auto-correlation is 1/10 is obtained in the following manner;

For the approximate straight line 1, the gradient $G_1$ is $$G_1 = \frac{\frac{Q_2 + Q_4}{2} - Q_0}{\frac{\tau_2 + \tau_4}{2}}$$

For the approximate straight line 2, the gradient $G_2$ is $$G_2 = \frac{\frac{Q_{l+2} + Q_{l+4}}{2} - Q_l}{\frac{\tau_{l+2} + \tau_{l+4}}{2} - \tau_l}$$

From the arithmetical mean of the above gradients, the most preferred time is $$\tau_e(0.1) = \frac{2Q_0}{(G_1 + G_2)} \times 0.9$$

Because ½ of the gradients $G_1$, $G_2$ is made by a bit shifting, the gradients $G_1$, $G_2$ can be calculated by performing a single multiplication. Also in the case the gradient is to be obtained from two points, since a single multiplication is necessary, it is possible to obtain the gradient from three points by the same number of multiplications, thus causing good precision. Further, since the arithmetical mean of the gradients is two approximate straight lines, a more precise approximate can be achieved. This delay time detector circuit is composed of a maximal value detecting section and a delay time calculating section.

Figure 14:
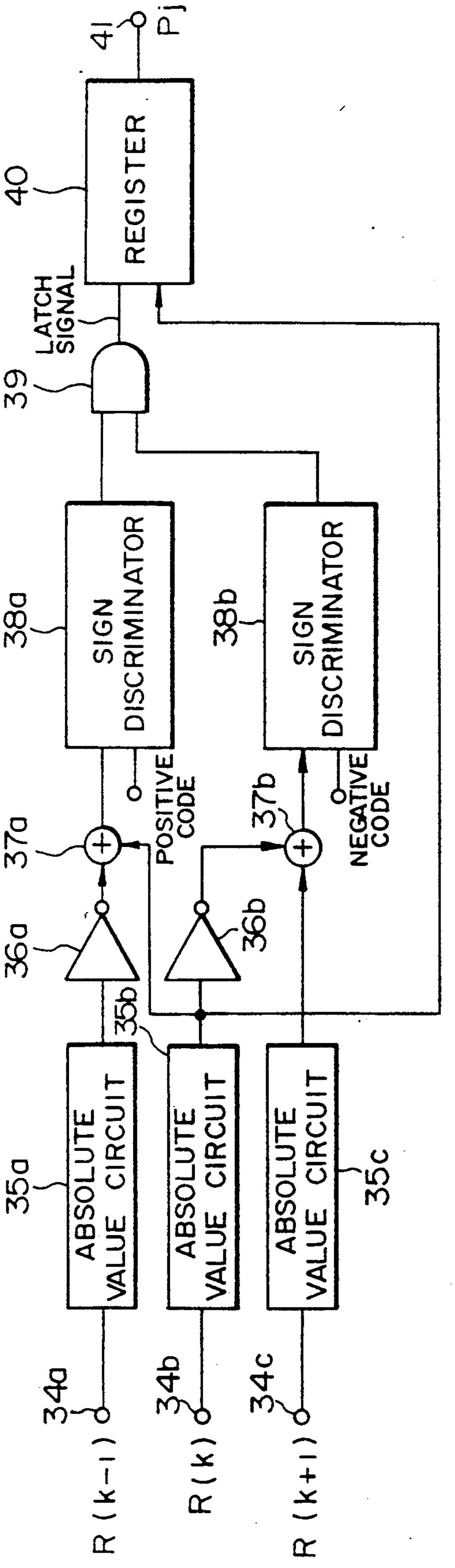
FIG. 14 is a block diagram showing a maximal value detecting unit of the apparatus of this invention.

FIG. 14 shows the maximal value detecting section of the delay time detector circuit. The maximal value detecting section is composed of input terminals 34*a* through 34*c*, absolute value circuits 35*a* through 35*c*, inverters 36*a*, 36*b*, adders 37*a*, 37*b*, sign discriminator circuits 38*a*, 38*b*, an AND circuit 39, a resistor circuit 40 for retaining the output when the latch signal is "1", and an output terminal 41. Now in the case in which a discrimination is to be made as to whether the k-th auto-correlation value R(k) is the maximal value or not will be explained. The (k−1)-th auto-correlation value R(k−1), the k-th auto-correlation value R(k) and the (k+1)-th auto-correlation value R(k+1) are inputted to the input terminals 34*a*, 34*b*, 34*c*, respectively, and are processed into absolute values by the respective absolute value circuits 35*a* through 35*c*. The auto-correlation value |R(k−1)| processed into an absolute value is inverted in sign by the inverter 36*a*, and is added with the auto-correlation value |R(k)|(processed into an absolute value) by the adder 37*a*. Then the value of |R(k)|−|R(k−1)| is calculated. The sign discriminator circuit 38*a* discriminates, by a logical operation, as to whether this value is a positive sign or not; if positive, the sign discriminator circuit 38*a* outputs "1", and if negative, it outputs "0". Likewise, the auto-correlation value |R(k)| inputted from the input terminal 34*b* and processed into an absolute value is inverted in sign, and the auto-correlation value |R(k+1)| processed into an absolute value is added by the adder 37*b*. Then the value of |R(k+1)| is calculated. The sign of this value is discriminated, by the sign discriminator circuit 38*b*, as to whether it is a negative sign or not; if negative, the sign discriminator circuit 38*b* outputs "1", and if positive, it outputs "0". The AND circuit 39 renders the latch signal to be "1" if |R(k)|−|R(k−1)| is positive and |R(k+1)|−|R(k)| is negative from the output results of the sign discriminator circuit 38*a*. The register circuit 40 retains the auto-correlation value |R(k)| (processed into an absolute value) if the latch signal is "1", and is reset if the latch signal is "0". In the foregoing mode of operation, the maximal value $P_j$(j=0, 1, . . . ,) is outputted.

Figure 15:
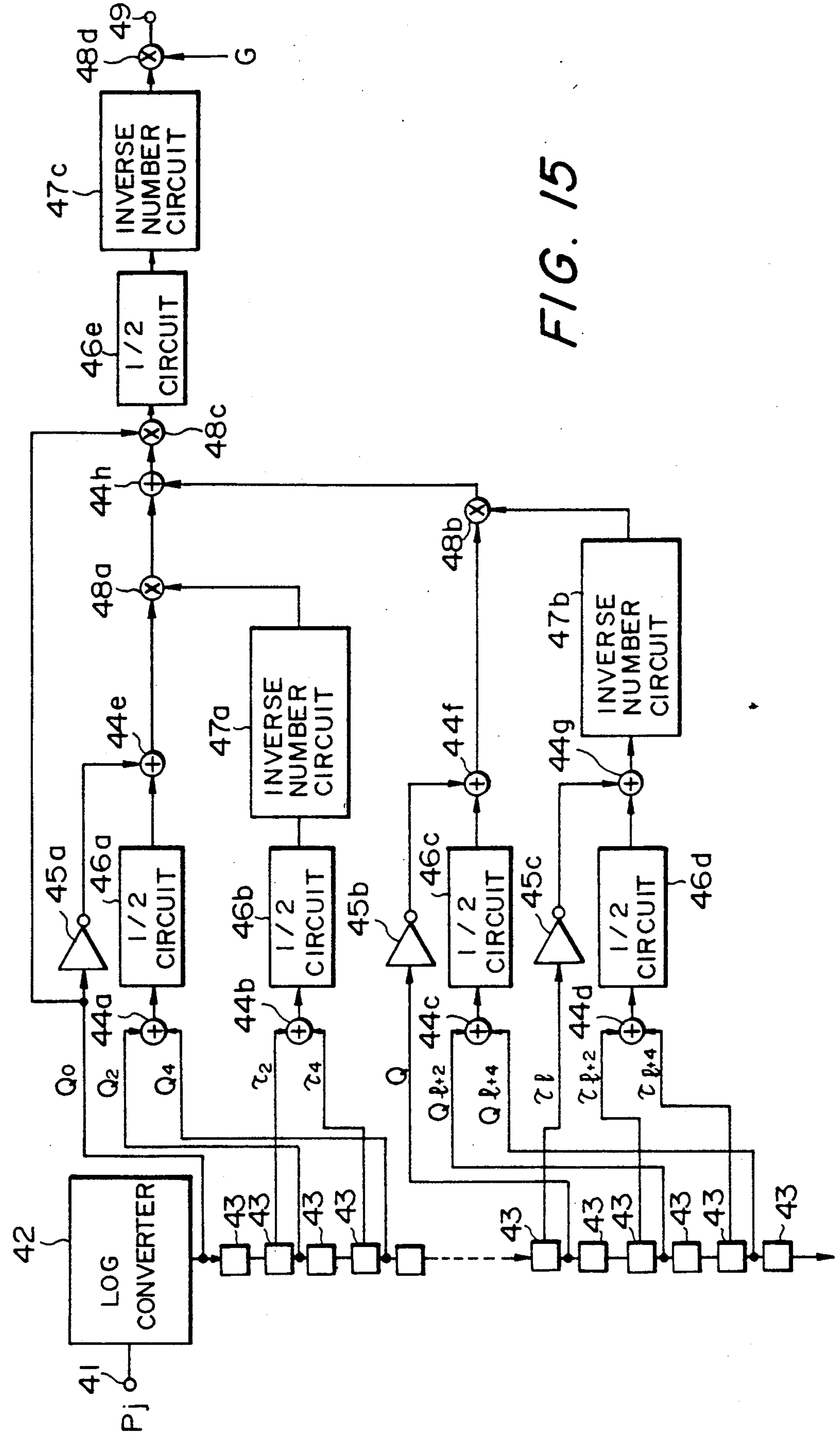
FIG. 15 is a block diagram shoWing a delay time calculating unit of the apparatus of this invention.

FIG. 15 shows one example of the delay time calculating section of the delay time detector circuit, in which section a delay time is calculated by a straight approximation from the maximal value $P_j$. The delay time calculating section, as shown in FIG. 15, is composed of an input terminal 41 for the maximal value, a log converter circuit 42, a delay element 43 for showing the sequentiality in a simulant fashion, adders 44*a* through 44*h*, inverters 45*a* through 45*c*, ½ circuits 46*a* through 46*e*, inverse number circuits 47*a* through 47*c*, multipliers 48*a* through 48*d*, and an output terminal 49. $P_j$ stands for the maximal value; $Q_4$, $Q_l$, $Q_{l+2}$, $Q_{l+4}$, log-converted maximal values; $\tau_2$, $\tau_4$, $\tau_l$, $\tau_{l+4}$, the delay times of the maximal values; G, a constant.

In operation, the maximal value $P_j$ inputted from the input terminal 41 enters the log converter circuit 42. This log converter circuit 42 is composed of a latch circuit for retaining the maximal value, for example, as an address value of ROM, a ROM with a log conversion table, a timing generator circuit, etc. As the maximal value is inputted, the ROM address corresponding to the maximal value is set. Then the converted log value is read from the ROM. Thus the maximal values $Q_0$, $Q_1$, $Q_2$, . . . , are successively log-converted and are then outputted. Of these maximal values, $Q_2$ and $Q_4$ are summed by the adder 44*a* and are multiplied by ½ in the ½ circuit 46*a*. This ½ multiplication is equivalent to the sign-expanded right shift with respect to the digital signal, and the ½ circuits 46*a* through 46*e* can be easily realized by known devices. The output of the ½ circuit 46*a* is added with the maximal value $Q_0$ (sign-inverted by the inverter 45*a*) by the adder 44*e*. The delay times $\tau_2$, $\tau_4$ of $Q_2$ and $Q_4$ are summed by the adder 44*b*, are multiplied by ½ by the ½ circuit 46*b*, are converted into inverse numbers by the inverse number circuit 47*a*, and are multiplied by the output of the adder 44*e* by the multiplier 48*a*. In the foregoing mode of operation, the gradients of the approximate straight lines of $Q_0$, $Q_2$ and $Q_4$. Further, the log-converted maximal values $Q_{l+2}$ and $Q_{l+4}$ are summed by the adder 44*c*, are multiplied by ½ by the ½ circuit 46*c*, and are added with the Q (code-inverted by the inverter 45*b*) by the adder 44*f*. Likewise, the delay times $\tau_{l+2}$, $\tau_{l+4}$ of $Q_{l+2}$ and $Q_{l+4}$ are summed by the adder 44*d*, are multiplied by ½ by the ½ circuit 46*d*, are added, by the adder 44*g* with the delay time $\tau_l$ of $Q_l$, and are converted into inverse numbers by the inverter 47*b*, whereupon the inverse numbers are multiplied with the output of the adder 44*f*. In the foregoing mode of operation, the gradients of approximate straight lines of $Q_l$, $Q_{l+2}$, $Q_{l+4}$ are calculated. These two gradients, namely, the outputs of the multipliers 48*a*, 48*b* are summed by the adder 44*h*, are multiplied with $Q_0$ by the multiplier 48*c*, and are multiplied by ½ by the ½ circuit 46*e*, whereupon the gradients are converted into inverse numbers by the inverse number circuit 47*c*.

Further, by multiplying the constant G to this inverse number by the multiplier 48*d*, it is possible to calculate the delay time which the auto-correlation is 1/G. For example, if G=10, the delay time $\tau_e(0.1)$ which the auto-correlation is 0.1 can be obtained. In this illustrated example, the most preferred delay time is calculated from an arithmetical mean of the gradients of two approximate straight lines spaced from each other by. Generally, is preferred to be small for precise calculation of the delay time from the gradients of two approximate straight lines adjacent to the origin. Practically, an LP usually contains a number of musics of the same genre or type, such as jazz, pops or classic; the music head of a first music is found to be analyzed. If the most preferred delay time is large, the most suitably large delay time for the second music onwards can be obtained from the approximate straight line near the large delay time by increasing According to the sound reproducing apparatus of this invention, the auto-correlation function can be calculated in a short time with simple construction. Thus it is possible to add effect sounds such as the most suitable initial reflective sound and reechoed sound within a practical time.

What is claimed is:

1. A sound reproducing apparatus comprising:

three-value signal converter circuit for converting a sound source signal into three-value signals of 1, 0 and −1;

auto-correlation calculating circuit for calculating an auto-correlation value by using said three-value signals;

envelope curve extractor circuit for approximating said auto-correlation value rectilinearly to obtain an envelope curve;

delay time detector circuit for detecting a delay time in which said envelope curve decreases to a predetermined ratio; and effect sound adding means for adding an effect sound to said sound signal according to said delay time.

2. A sound reproducing apparatus according to claim 1, further including a mixer circuit for adding a stereo signal of right and left channels to said sound source signal to provide a monaural signal and for supplying said monaural signal to said three-value signal converter circuit, said sound source signal being a stereo signal.

3. A sound reproducing apparatus according to claim 1, further including a music head detector circuit for detecting a music head of said sound source signal, said effect sound adding means being operable, in response to the detection of each said music head of said sound source signal, to restart the adding of said effect sound for each and every music head detected.

4. A sound reproducing apparatus according to claim 1, wherein said three-value signal converter circuit includes:

a first comparator having a positive input terminal to which a positive sound signal is supplied, and a negative input terminal to which a predetermined threshold value is supplied; and a second comparator having a negative input terminal to which a negative sound signal is supplied, and a positive input terminal to which said predetermined threshold value is supplied;

said three-value signal being obtained from a composite output of said first and second comparators.

5. A sound reproducing apparatus according to claim 4, wherein said predetermined threshold value is less than a maximal absolute value of said sound source signal and is greater than a residual noise level of the apparatus.

6. A sound reproducing apparatus according to claim 4, wherein said three-value signal is converted within a predetermined sampling period.

7. A sound reproducing apparatus according to claim 1, wherein said auto-correlation calculating circuit is capable of performing a logical operation wherein, an absolute value of an i-th three-value signal is $A_i$ and a sign bit of the i-th three-value signal is $S_i$, an absolute bit representing the absolute value is $A_i$, $k = A_i A_{i+k}$, and the sign bit is $S_i$, $k = [A_i + S_{i+k}]S_i + S_{i+k}$, where k is a delay time; and said auto-correlation value R(k) is calculated by the equation: $R(k) = \Sigma(S_{i,k}, A_{i,k})$.

8. A sound reproducing apparatus according to claim 7, wherein auto-correlation calculating circuit includes:

a pair of memories for successively and alternately storing therein said there-value signals previously converted within a predetermined sampling period;

a logical operation circuit for successively reading said three-value signals from said memories and performing an arithmetic operation of said auto-correlation to produce a logical arithmetic result;

a binary counter adapted to be reset in response to the reading of said three-value signals by said logical operation circuit and for making successive up and down counts according to the logical arithmetic result; and a microcomputer for repeatedly controlling the up and down count of said binary counter for a predetermined integration time.

9. A sound reproducing apparatus according to claim 1, wherein said envelope curve extractor circuit obtains an arithmetical mean value of a predetermined number of said auto-correlations and approximates an envelope curve of an auto-correlation function by a straight line extending between said arithmetical mean value and said auto-correlation value when the delay time is 0.

10. A sound reproducing apparatus according to claim 1, wherein said envelope curve extractor circuit includes:

a maximal value detector circuit for detecting a maximal value of the inputted auto-correlation value and for sequentially outputting a plurality of maximal value;

an adder for adding a plurality of the maximal values sequentially outputted from said maximal value detector circuit to produce a sum;

a dividing circuit for obtaining an arithmetical mean value by dividing the sum of the added maximal values by a number indicating the number of maximal values added; and a comparator for comparing said arithmetical mean value with said auto-correlation value when the delay time is 0.

11. A sound reproducing apparatus according to claim 1, wherein said auto-correlation calculating circuit includes:

an exclusive OR circuit for performing an arithmetical operation of sign bits of said three-value signals as the sign bits are inputted to said exclusive OR circuit and producing an output;

an AND circuit for performing an arithmetical operation of absolute bits of said three-value signals as the absolute bits are inputted to said AND circuit and producing an output; and an up and down counter circuit for receiving the output of said AND circuit, said up/down counter circuit for producing an increment operation when the output of said exclusive OR circuit is a logical 0, and also for producing a decrement operation when the output of said exclusive OR circuit is a logical 1.

12. A sound reproducing apparatus according to claim 11, including a plurality of sets of exclusive OR and AND circuits for receiving said three-value signals, and also including a plurality of said up and down counter circuits, each one corresponding to a respective one of said exclusive OR and AND circuits.

13. A sound reproducing apparatus according to claim 1, wherein said delay time detector circuit includes:

a maximal value detecting section for outputting a maximal value of said auto-correlation value; and a delay time calculating section for calculating the delay time by a rectilinear approximation from said maximal value.

14. A sound reproducing apparatus according to claim 1, wherein said maximal value detecting section includes:

an absolute vale circuit for outputting at least two successive auto-correlation values, each as an absolute value;

an arithmetic unit for performing a differential arithmetic operation with respect to the absolute value of each of the successive auto-correlation values and producing one of a positive and negative sign output;

a sign discriminator circuit for outputting a latch signal, dependent upon said sign output of said differential arithmetic unit being one of positive and negative; and a register circuit for retaining the absolute value of said auto-correlation value when said sign output is positive in response to said latch signal and for resetting when said sign output is negative.

15. A sound reproducing apparatus according to claim 13, wherein said delay time calculating section includes:

a log converter circuit for log-converting the maximal value and outputting a log-converted signal;

a delay element for delaying the log-converted signal to produce delayed maximal values;

a first adder for adding said delayed maximal values and producing an output;

a first ½ circuit for multiplying the output of said first adder by ½ and producing a ½ output;

a second adder for adding said ½ output to the log-inverted output of said maximal value when the delay time is 0 and producing an output;

a second ½ circuit for multiplying the output of said second adder by ½ and producing a second ½ output;

an inverse number converter circuit for converting said second ½ output into an inverse number;

an arithmetic unit for multiplying the inverse number by a predetermined constant.

16. A sound reproducing method, comprising the steps of:

(a) converting a sound source signal into three-value signals of 0, 1, and −1;

(b) calculating an auto-correlation value from the three-value signals;

(c) obtaining an envelope curve by rectilinearly approximating the calculated auto-correlation value;

(d) detecting a delay time in which the obtained envelope curve decreases to a predetermined ratio; and (e) adding an effect sound to the sound source based upon the detected delay time.

17. The method of claim 16, further comprising the step of:

(f) detecting a plurality of music heads in the sound source signal and repeating steps (a)-(e) for each music head detected.

* * * * *